(12) United States Patent
Wang et al.

(10) Patent No.: US 11,398,797 B1
(45) Date of Patent: Jul. 26, 2022

(54) CRYSTAL OSCILLATOR AND METHOD FOR FABRICATING THE SAME

(71) Applicant: TXC CORPORATION, Taipei (TW)

(72) Inventors: Wun-Kai Wang, Ping Cheng (TW);
Cheng-Wei Lin, Ping Cheng (TW);
Chih Hung Chiu, Ping Cheng (TW);
Chih Hsun Chu, Ping Cheng (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 17/517,040

(22) Filed: Nov. 2, 2021

(51) Int. Cl.
*H03B 5/32* (2006.01)
*H01L 41/053* (2006.01)
*H01L 41/313* (2013.01)

(52) U.S. Cl.
CPC ............ *H03B 5/32* (2013.01); *H01L 41/053* (2013.01); *H01L 41/313* (2013.01)

(58) Field of Classification Search
CPC ........ H01L 41/053; H01L 41/313; H03B 5/32
USPC .................. 331/158, 116 FE, 68; 438/16
See application file for complete search history.

(56) References Cited

U.S. PATENT DOCUMENTS

| 2011/0169584 A1* | 7/2011 | Fukuda | G04R 20/10 29/25.35 |
| 2013/0077449 A1* | 3/2013 | Aratake | G04R 20/10 174/257 |

FOREIGN PATENT DOCUMENTS

| JP | 2007251239 A | * 9/2007 |
| TW | 561688 B | 11/2003 |

\* cited by examiner

*Primary Examiner* — Arnold M Kinkead
(74) *Attorney, Agent, or Firm* — Birch, Stewart, Kolasch & Birch, LLP (57) ABSTRACT

A crystal oscillator and a method for fabricating the same is provided. In the method, a crystal package is provided. The crystal package includes a crystal blank and at least one laser-penetrating area. The laser-penetrating area is exposed outside. The crystal package is provided with at least one airtight space therein. At least one getter is formed in the airtight space. The location of the laser-penetrating area corresponds to that of the getter. A laser beam penetrates through the laser-penetrating area to activate the getter, thereby increasing the degree of vacuum of the airtight space.

11 Claims, 6 Drawing Sheets

CRYSTAL OSCILLATOR AND METHOD FOR FABRICATING THE SAME

BACKGROUND OF THE INVENTION

Field of the Invention

The present invention relates to package technology, particularly to a crystal oscillator and a method for fabricating the same.

Description of the Related Art

As known, in accordance with the trend of system integration, a variety of electronic systems nowadays are equipped with clock components, and integrating the clock components with sensing elements into the electronic systems has become one of the mainstream technologies in semiconductor packaging technical field. Since taking a quartz crystal piezoelectric element as an oscillator provides an outstanding accuracy and stability, a quartz crystal is mostly adopted for performing as a clock component in the current practice. According to the International Electrotechnical Commission (IEC), quartz-crystal-piezoelectric-element oscillators include four categories: simple package crystal oscillators (SPXO), voltage-controlled crystal oscillators (VCXO), temperature-compensated crystal oscillators (TCXO), and oven-controlled crystal oscillators (OCXO). However, with the rapid developments of the IC industries, it is believed that electronic products tend to show more functions, higher performances, and lighter weight. As such, in order to meet the packaging requirements for high-intensity integration and miniaturization of semiconductor IC chips, it is obvious that the existing packaging technologies are no longer adequate.

In general, in accordance with the miniaturization of semiconductor piezoelectric devices, the quartz crystal and the integrated circuit are usually respectively packaged along with ceramic materials first, and the subsequent electrical connections are successively performed by employing the current existing technologies. However, since the quartz crystal may decline to contact with its bottom base layer, the existing packaging structure usually has a cavity on the surface of its bottom base layer so as to use such cavity for accommodating the quartz crystal. In the cavity, the quartz crystal adheres to the ceramic base through an adhesive. Nevertheless, the performance of the quartz crystal becomes poor due to aging of the adhesive. Besides, the ceramic packaging structure includes multiple stacked ceramic layers. The ceramic layers are difficultly aligned to each other. If the ceramic layers are not precisely aligned to each other, the performance of the quartz crystal will become poor, and the whole ceramic package will not be minimized. In order to precisely align the ceramic layers, the fabrication cost needs to increase. In addition, when the semiconductor piezoelectric devices are fabricated, the volume of an electrode layer on the quartz crystal needs to be trimmed by a laser beam. The trimming process will produce debris in the ceramic package. The debris increases the serial resistance of the quartz crystal to reduce the performance of the quartz crystal.

To overcome the abovementioned problems, the present invention provides a crystal oscillator and a method for fabricating the same, so as to solve the afore-mentioned problems of the prior art.

SUMMARY OF THE INVENTION

The primary objective of the present invention is to provide a crystal oscillator and a method for fabricating the same, which absorb debris in a crystal package to increase the degree of vacuum.

In an embodiment of the present invention, a method for fabricating a crystal oscillator including: providing a crystal package, wherein the crystal package comprises a crystal blank and at least one laser-penetrating area, the crystal package is provided with at least one airtight space therein, the at least one laser-penetrating area is arranged between the at least one airtight space and an outside environment of the crystal package, at least one getter is formed in the at least one airtight space, and a location of the at least one laser-penetrating area is aligned to that of the at least one getter; and by a laser beam, penetrating through the at least one laser-penetrating area to activate the at least one getter, thereby increasing degree of vacuum of the at least one airtight space.

In an embodiment of the present invention, the step of providing the crystal package includes: forming the at least one getter on at least one of a bottom surface of a top cover, a top surface of a middle resonance substrate, a bottom surface of the middle resonance substrate, and a top surface of the bottom base, wherein the middle resonance substrate comprises the crystal blank, and at least one of the top cover, the middle resonance substrate, and the bottom base has the at least one laser-penetrating area; and bonding the bottom surface of the top cover to the top surface of the middle resonance substrate and bonding the top surface of the bottom base to the bottom surface of the middle resonance substrate, thereby forming the at least one airtight space where the at least one getter is located and providing the crystal package.

In an embodiment of the present invention, the middle resonance substrate is penetrated with at least one opening.

In an embodiment of the present invention, the middle resonance substrate further includes a peripheral region that surrounds the crystal blank, and the thickness of the crystal blank is unequal to that of the peripheral region.

In an embodiment of the present invention, the at least one getter comprises titanium (Ti), zirconium (Zr), hafnium (Hf), ruthenium (Ru), or a combination of these.

In an embodiment of the present invention, the at least one laser-penetrating area comprises fused quartz, fused silica, soda-lime glass, or a combination of these.

In an embodiment of the present invention, the laser beam has a wavelength of 200-2000 nm.

In an embodiment of the present invention, a crystal oscillator includes a crystal package and at least one getter. The crystal package includes a crystal blank and at least one laser-penetrating area, the crystal package is provided with at least one airtight space therein, and the at least one laser-penetrating area is arranged between the at least one airtight space and an outside environment of the crystal package. The getter is formed in the at least one airtight space and configured to increase the degree of vacuum of the at least one airtight space, wherein the location of the at least one laser-penetrating area corresponds to that of the at least one getter.

In an embodiment of the present invention, the crystal package includes a bottom base, a middle resonance substrate, and a top cover. The middle resonance substrate includes the crystal blank, wherein the bottom surface of the middle resonance substrate is bonded to the top surface of the bottom base. The bottom surface of the top cover is bonded to the top surface of the middle resonance substrate. At least one of the bottom base, the middle resonance substrate, and the top cover has the at least one laser-penetrating area. The bottom base, the middle resonance substrate, and the top cover form the at least one airtight space where the at least one getter is located.

In an embodiment of the present invention, the middle resonance substrate is penetrated with at least one opening.

In an embodiment of the present invention, the middle resonance substrate further includes a peripheral region that surrounds the crystal blank, and the thickness of the crystal blank is unequal to that of the peripheral region.

In an embodiment of the present invention, the at least one getter comprises titanium (Ti), zirconium (Zr), hafnium (Hf), ruthenium (Ru), or a combination of these.

In an embodiment of the present invention, the at least one laser-penetrating area includes fused quartz, fused silica, soda-lime glass, or a combination of these.

To sum up, the crystal oscillator and the method for fabricating the same use the getter to absorb debris in the crystal package, thereby increasing the degree of vacuum.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, a crystal oscillator and a method for fabricating the same will be provided. The crystal oscillator and the method for fabricating the same use at least one getter to absorb debris in a crystal package, thereby increasing the degree of vacuum.

Figure 1:
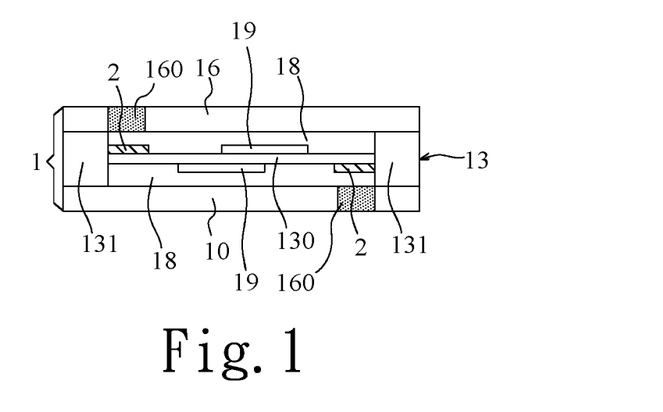
FIG. 1 is a diagram schematically showing a crystal oscillator according to a first embodiment of the present invention.
Figure 2:
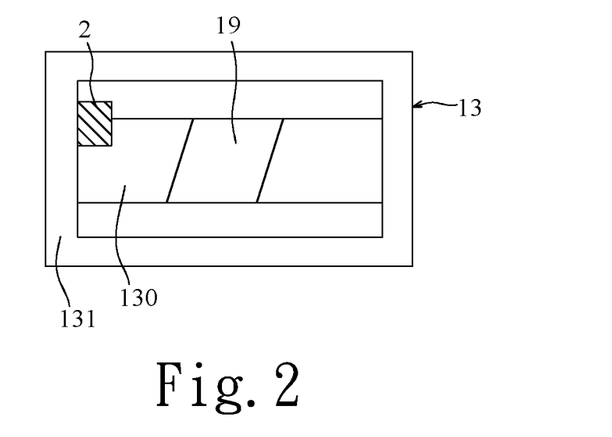
FIG. 2 is a top view of a middle resonance substrate, an electrode layer, and a getter of the crystal oscillator according to the first embodiment of the present invention.

FIG. 1 is a diagram schematically showing a crystal oscillator according to a first embodiment of the present invention. FIG.2 is a top view of a middle resonance substrate, an electrode layer, and a getter of the crystal oscillator according to the first embodiment of the present invention. The first embodiment of the crystal oscillator is introduced as follows. Referring to FIG. 1 and FIG. 2, the crystal oscillator includes a crystal package 1 and at least one getter 2. The getter 2 includes titanium (Ti), zirconium (Zr), hafnium (Hf), ruthenium (Ru), Ti oxide, Zr oxide, Hf oxide, Ru oxide, a Ti-based compound, a Zr-based compound, a Hf-based compound, a Ru-based compound, or a combination of these. The crystal package 1 includes a crystal blank 130 and at least one laser-penetrating area 160. The laser-penetrating area 160 has a size approximate to the spot size of a laser beam or the size of the getter 2, but the present invention is not limited thereto. The other area of the crystal package 1 where a laser beam does not penetrate may be made of ceramic or other suitable materials. The laser-penetrating area 160 includes fused quartz, fused silica, soda-lime glass, or a combination of these. The location of the laser-penetrating area 160 is not limited. The crystal package 1 is provided with at least one airtight space 18 therein. The laser-penetrating area 160 is arranged between the airtight space 180 and the outside environment of the crystal package 1. The getter 2 is formed in the airtight space 18 and configured to increase the degree of vacuum of the airtight space 18. The location of the laser-penetrating area 160 corresponds to that of the getter 2. For clarity and convenience, the first embodiment exemplifies two getters 2, two laser-penetrating areas 160, and two airtight spaces 18. The locations of the laser-penetrating areas 160 are respectively aligned to those of the getters 2. The getters 2 are respectively located in the airtight spaces 18. The height of the airtight space 18 is greater than or equal to the thickness of the getter 2. The getter 2 may be a triangular-shaped getter, a rectangular-shaped getter, or a L-shaped getter, but the present invention is not limited thereto.

The structure of the crystal package 1 is not limited. The crystal package 1 may include a bottom base 10, a middle resonance substrate 13, and a top cover 16. The middle resonance substrate 13 includes the crystal blank 130. The bottom surface of the middle resonance substrate 13 is bonded to the top surface of the bottom base 10. The bottom surface of the top cover 16 is bonded to the top surface of the middle resonance substrate 13. The bottom base 10, the middle resonance substrate 13, and the top cover 16 form the airtight spaces 18 where the getters 2 are located. At least one of the bottom base 10, the middle resonance substrate 13, and the top cover 16 has at least one laser-penetrating area 160. In such a case, the bottom base 10 and the top cover 16 have the laser-penetrating areas 160. The bottom base 10, the middle resonance substrate 13, and the top cover 16 may be directly bonded or bonded through bonding materials, such as adhesive or bonding metal. The middle resonance substrate 13 may further include a peripheral region 131 that surrounds the crystal blank 130. The thickness of the crystal blank 130 is unequal to that of the peripheral region 131 according to requirements. In the first embodiment, the thickness of the crystal blank 130 is less than that of the peripheral region 131. The getters 2 absorb debris in the airtight spaces 18 and increase the degree of vacuum of the airtight spaces 18. The present invention is not limited to the position where the getters 2 are located. In the first embodiment, the getters 2 are respectively formed on the top and bottom of the crystal blank 130. The top and bottom of the crystal blank 130 are also provided with electrode layers 19.

Figure 3A:
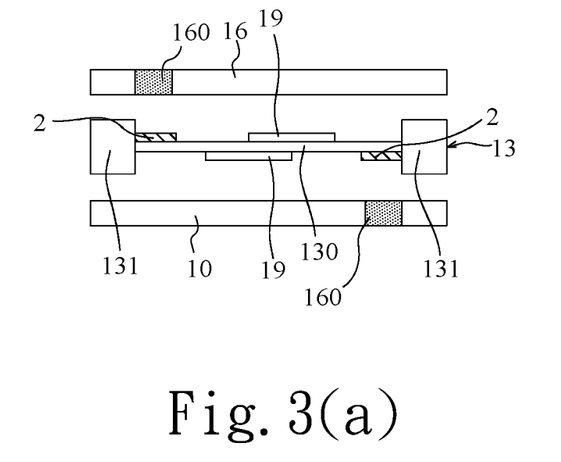
FIGS. 3(a)-3(c) are diagrams schematically showing the steps of fabricating the crystal oscillator according to the first embodiment of the present invention.
Figure 3B:
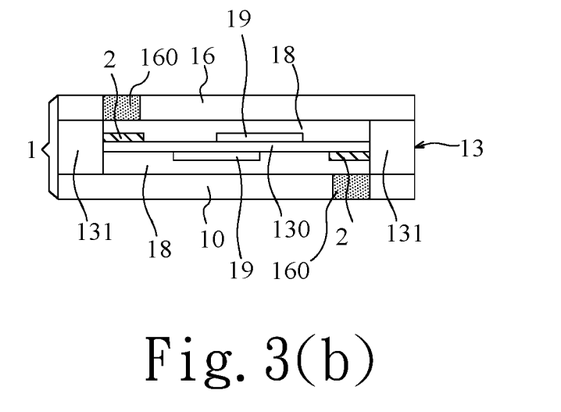
Figure 3C:
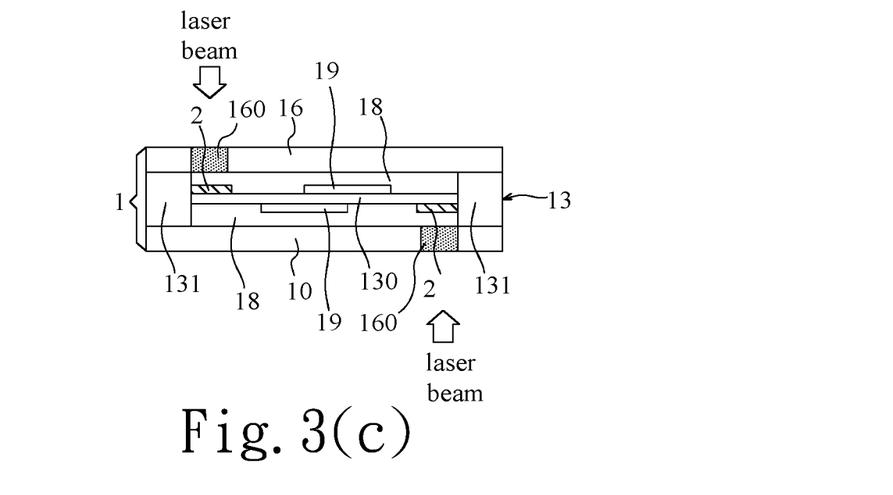

FIGS. 3(a)-3(c) are diagrams schematically showing the steps of fabricating the crystal oscillator according to the first embodiment of the present invention. The method for fabricating the crystal oscillator is introduced as follows. As shown in FIG. 3(a), at least one getter 2 is formed on at least one of the bottom surface of the top cover 16, the top surface of the middle resonance substrate 13, the bottom surface of the middle resonance substrate 13, and the top surface of the bottom base 10. In the first embodiment, the getters 2 are formed on the top surface and the bottom surface of the middle resonance substrate 13. As shown in FIG. 3(b), the bottom surface of the top cover 16 is bonded to the top surface of the middle resonance substrate 13 and the top surface of the bottom base 10 is bonded to the bottom surface of the middle resonance substrate 13, thereby forming the airtight spaces 18 where the getters 2 are located and providing the crystal package 1. As shown in FIG. 3(c), a laser beam penetrates through the laser-penetrating areas 160 to activate the getters 2, thereby increasing the degree of vacuum of the airtight space 18. In practice, the laser beam has a wavelength of 200-2000 nm. In general, the locations of the electrode layers 19 correspond to those of the getters 2. As a result, the laser beam can trim the volumes of the electrode layers 19 through the laser-penetrating areas 160, thereby adjusting the oscillating frequency of the crystal oscillator. Since the trimming process produces the debris in the airtight spaces 18, the getters 17 have to be activated to absorb the debris. Provided that substantially the same result is achieved, the steps of the diagrams shown in FIGS. 3(a)-3(c) need not be in the exact order shown and need not be contiguous, that is, other steps can be intermediate. Alternatively, the steps of FIGS. 3(a)-3(b) can be replaced with a step of providing the crystal package 1.

Figure 4:
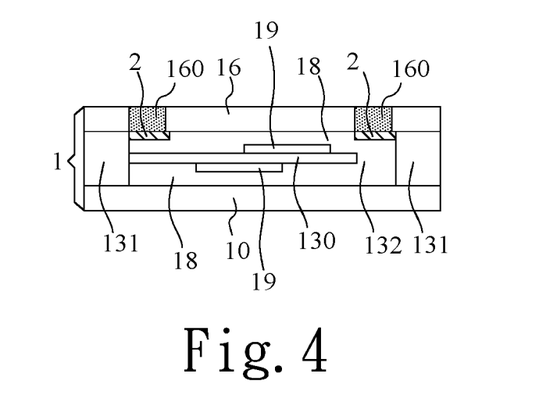
FIG. 4 is a diagram schematically showing a crystal oscillator according to a second embodiment of the present invention.
Figure 5:
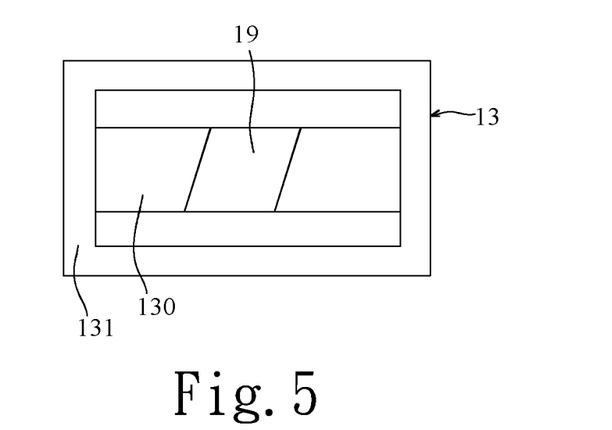
FIG. 5 is a top view of a middle resonance substrate and an electrode layer of the crystal oscillator according to the second embodiment of the present invention.

FIG. 4 is a diagram schematically showing a crystal oscillator according to a second embodiment of the present invention. FIG. 5 is a top view of a middle resonance substrate and an electrode layer of the crystal oscillator according to the second embodiment of the present invention. The second embodiment of the crystal oscillator is introduced as follows. Referring to FIG. 4 and FIG. 5, the second embodiment is different from the first embodiment in the number of the airtight space 18, the positions of the getters 2 and the laser-penetrating areas 160, and the structure of the crystal blank 130. In the second embodiment, the number of the airtight space 18 is one. The getters 2 are formed on the bottom surface of the top cover 16. The top cover 16 has two laser-penetrating areas 160. The crystal blank 130 is penetrated with at least one opening 132. The second embodiment exemplifies one opening 132 that communicates with the airtight space 18.

Figure 6A:
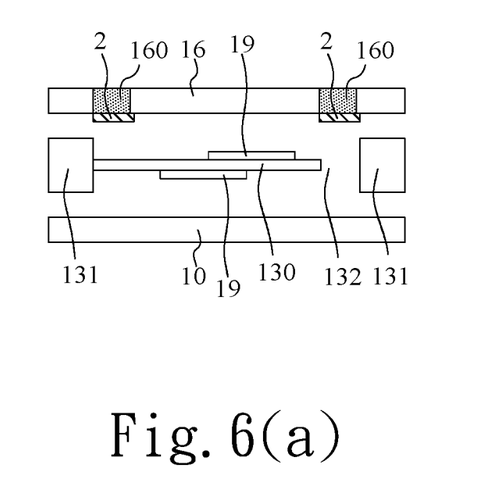
FIGS. 6(a)-6(c) are diagrams schematically showing the steps of fabricating the crystal oscillator according to the second embodiment of the present invention.
Figure 6B:
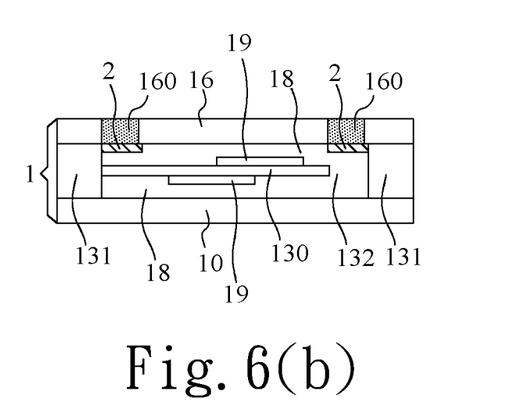
Figure 6C:
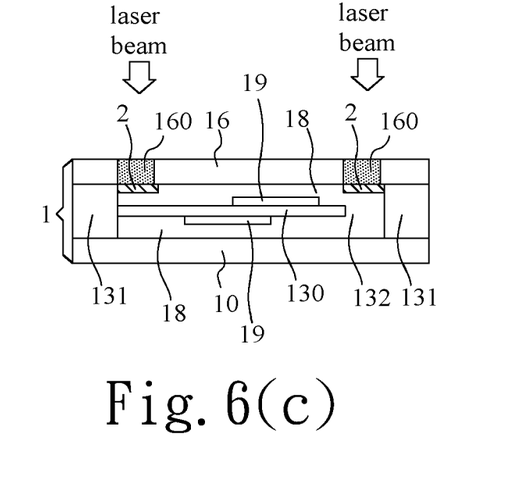

FIGS. 6(a)-6(c) are diagrams schematically showing the steps of fabricating the crystal oscillator according to the second embodiment of the present invention. The method for fabricating the crystal oscillator is introduced as follows. FIG. 6(a) is different from FIG. 3(a) in the positions of the getters 2 and the laser-penetrating areas 160 and the structure of the crystal blank 130. In the second embodiment, the getters 2 are formed on the bottom surface of the top cover 16, the top cover 16 has two laser-penetrating areas 160, and the crystal blank 130 is penetrated with at least one opening 132. The steps of FIGS. 6(b)-6(c) are the same to the steps of FIGS. 3(b)-3(c) so will not be reiterated.

Figure 7:
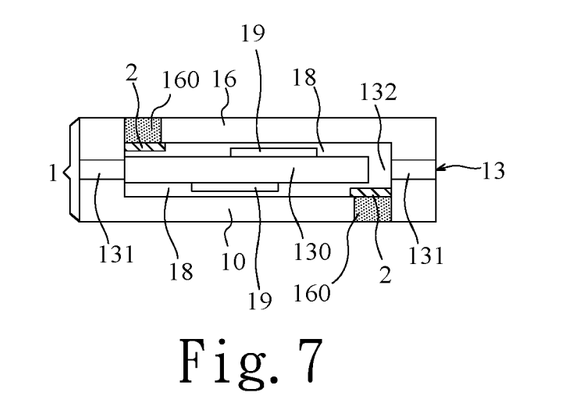
FIG. 7 is a diagram schematically showing a crystal oscillator according to a third embodiment of the present invention.
Figure 8:
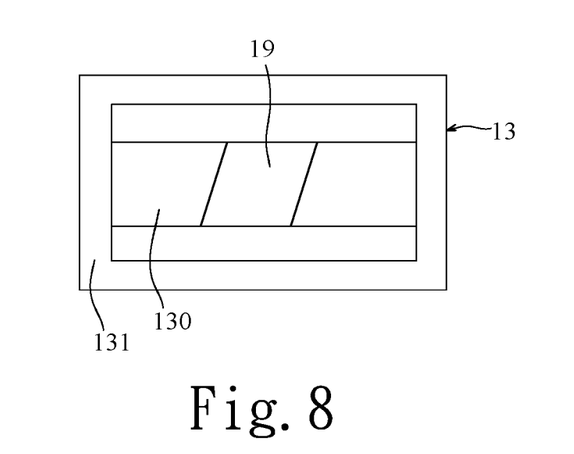
FIG. 8 is a top view of a middle resonance substrate and an electrode layer of the crystal oscillator according to the third embodiment of the present invention.

FIG. 7 is a diagram schematically showing a crystal oscillator according to a third embodiment of the present invention. FIG. 8 is a top view of a middle resonance substrate and an electrode layer of the crystal oscillator according to the third embodiment of the present invention. The third embodiment of the crystal oscillator is introduced as follows. Referring to FIG. 7 and FIG. 8, the third embodiment is different from the second embodiment in the positions of the getters 2 and the laser-penetrating areas 160 and the structure of the crystal blank 130. In the third embodiment, the getters 2 are formed on the bottom surface of the top cover 16 and the top surface of the bottom base 10. The bottom base 10 and the top cover 16 have the laser-penetrating areas 160. The thickness of the crystal blank 130 is greater than that of the peripheral region 131 of the middle resonance substrate 13.

Figure 9A:
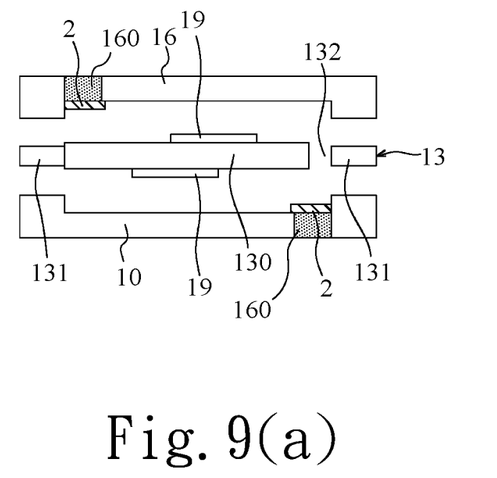
FIGS. 9(a)-9(c) are diagrams schematically showing the steps of fabricating the crystal oscillator according to the third embodiment of the present invention.
Figure 9B:
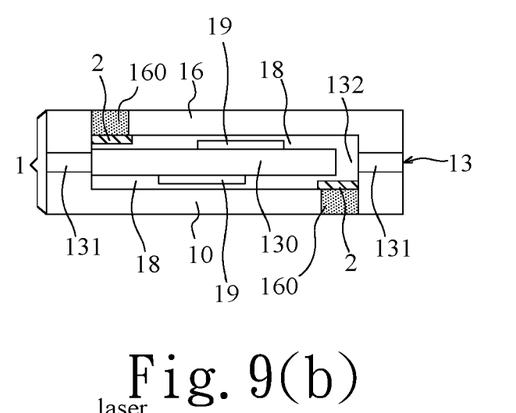
Figure 9C:
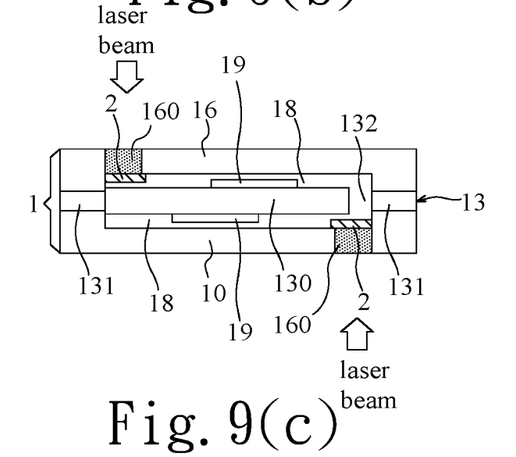

FIGS. 9(*a*)-9(*c*) are diagrams schematically showing the steps of fabricating the crystal oscillator according to the third embodiment of the present invention. The method for fabricating the crystal oscillator is introduced as follows. FIG. 9(*a*) is different from FIG. 9(*a*) in the positions of the getters 2 and the laser-penetrating areas 160 and the structure of the crystal blank 130. In the third embodiment, the getters 2 are formed on the bottom surface of the top cover 16 and the top surface of the bottom base 10, the bottom base 10 and the top cover 16 have the laser-penetrating areas 160, and the thickness of the crystal blank 130 is greater than that of the peripheral region 131 of the middle resonance substrate 13. The steps of FIGS. 9(*b*)-9(*c*) are the same to the steps of FIGS. 6(*b*)-6(*c*) so will not be reiterated.

According to the embodiments provided above, the crystal oscillator and the method for fabricating the same use the getter to absorb debris in the crystal package, thereby increasing the degree of vacuum.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating a crystal oscillator comprising:
    providing a crystal package, wherein the crystal package comprises a middle resonance substrate and at least one laser-penetrating area, the crystal package is provided with at least one airtight space therein, the at least one laser-penetrating area is arranged between the at least one airtight space and an outside environment of the crystal package, at least one getter is formed in the at least one airtight space, and a location of the at least one laser-penetrating area is aligned to that of the at least one getter; and
    by a laser beam, penetrating through the at least one laser-penetrating area to activate the at least one getter, thereby increasing degree of vacuum of the at least one airtight space,
    wherein the middle resonance substrate comprises a crystal blank and a peripheral region that surrounds the crystal blank, and a thickness of the crystal blank is unequal to that of the peripheral region.

2. The method for fabricating a crystal oscillator according to claim 1, wherein the step of providing the crystal package comprises:
    forming the at least one getter on at least one of a bottom surface of a top cover, a top surface of the middle resonance substrate, a bottom surface of the middle resonance substrate, and a top surface of a bottom base, wherein at least one of the top cover, the middle resonance substrate, and the bottom base has the at least one laser-penetrating area; and
    bonding the bottom surface of the top cover to the top surface of the middle resonance substrate and bonding the top surface of the bottom base to the bottom surface of the middle resonance substrate, thereby forming the at least one airtight space where the at least one getter is located and providing the crystal package.

3. The method for fabricating a crystal oscillator according to claim 2, wherein the middle resonance substrate is penetrated with at least one opening.

4. The method for fabricating a crystal oscillator according to claim 1, wherein the at least one getter comprises titanium (Ti), zirconium (Zr), hafnium (Hf), or ruthenium (Ru).

5. The method for fabricating a crystal oscillator according to claim 1, wherein the at least one laser-penetrating area comprises fused quartz, fused silica, or soda-lime glass.

6. The method for fabricating a crystal oscillator according to claim 1, wherein the laser beam has a wavelength of 200-2000 nm.

7. A crystal oscillator comprising:
    a crystal package, wherein the crystal package comprises a middle resonance substrate and at least one laser-penetrating area, the crystal package is provided with at least one airtight space therein, and the at least one laser-penetrating area is arranged between the at least one airtight space and an outside environment of the crystal package; and
    at least one getter formed in the at least one airtight space and configured to increase degree of vacuum of the at least one airtight space, wherein a location of the at least one laser-penetrating area is aligned to that of the at least one getter,
    wherein the middle resonance substrate comprises a crystal blank and a peripheral region that surrounds the crystal blank, and a thickness of the crystal blank is unequal to that of the peripheral region.

8. The crystal oscillator according to claim 7, wherein the crystal package further comprises:
    a bottom base, wherein a bottom surface of the middle resonance substrate is bonded to a top surface of the bottom base; and
    a top cover with a bottom surface thereof bonded to a top surface of the middle resonance substrate, wherein at least one of the bottom base, the middle resonance substrate, and the top cover has the at least one laser-penetrating area, and the bottom base, the middle resonance substrate, and the top cover form the at least one airtight space where the at least one getter is located.

9. The crystal oscillator according to claim 8, wherein the middle resonance substrate is penetrated with at least one opening.

10. The crystal oscillator according to claim 7, wherein the at least one getter comprises titanium (Ti), zirconium (Zr), hafnium (Hf), or ruthenium (Ru).

11. The crystal oscillator according to claim 7, wherein the at least one laser-penetrating area comprises fused quartz, fused silica, or soda-lime glass.

* * * * *